United States Patent
Zuo et al.

(10) Patent No.: US 10,553,460 B2
(45) Date of Patent: Feb. 4, 2020

(54) GROOVE-TYPE DRYING STRUCTURE

(71) Applicant: CHANGZHOU S.C EXACT EQUIPMENT CO., LTD., Changzhou, Jiangsu Province (CN)

(72) Inventors: Guojun Zuo, Changzhou (CN); Hongye Dai, Changzhou (CN)

(73) Assignee: CHANGZHOU S.C EXACT EQUIPMENT CO., LTD., Changzhou (CN)

( * ) Notice: Subject to any disclaimer, the term of this patent is extended or adjusted under 35 U.S.C. 154(b) by 108 days.

(21) Appl. No.: 15/865,605

(22) Filed: Jan. 9, 2018

(65) Prior Publication Data
US 2018/0130676 A1 May 10, 2018

Related U.S. Application Data

(63) Continuation of application No. PCT/CN2016/082456, filed on May 18, 2016.

(30) Foreign Application Priority Data

Mar. 23, 2016 (CN) .................. 2016 2 0224519 U

(51) Int. Cl.
*H01L 21/67* (2006.01)
*F26B 9/06* (2006.01)
(Continued)

(52) U.S. Cl.
CPC .......... *H01L 21/67034* (2013.01); *F26B 9/06* (2013.01); *F26B 21/04* (2013.01); *F26B 21/10* (2013.01)

(58) Field of Classification Search
CPC .. F26B 9/06; F26B 21/04; F26B 21/10; H01L 21/67034
(Continued)

(56) References Cited

U.S. PATENT DOCUMENTS 1,364,365 A * 1/1921 Golden ................. A61H 33/06
454/197
2,675,629 A * 4/1954 Fisher ................... F26B 11/184
34/135
(Continued)

FOREIGN PATENT DOCUMENTS

CA          2969012 C  *  1/2019  ............. F26B 11/00
CN        202813984 U     3/2013
(Continued)

OTHER PUBLICATIONS

State Intellectual Property Office of the P.R. China (ISR/CN), "International Search Report for PCT/CN2016/082456", China, dated Dec. 28, 2016.

*Primary Examiner* — Stephen M Gravini
(74) *Attorney, Agent, or Firm* — Locke Lord LLP; Tim Tingkang Xia, Esq.

(57) ABSTRACT

A groove-type drying structure includes a drying groove having a cover. The drying groove is internally provided with an inner groove body. The inner groove body forms air current channels with the two sides and the bottom part of the drying groove. The upper part of the drying groove is provided with an air outlet, and the inner groove body is provided with an air compensation port. A heating device and a temperature detector are installed on the air current channels at the two sides. An air wheel is arranged in the air current channel at the bottom part, an air inlet of the air wheel is communicated with an inner chamber of the inner groove body, and a rotating shaft of the air wheel is connected with a motor installed in the bottom part of the drying groove.

2 Claims, 1 Drawing Sheet

(51) Int. Cl.
*F26B 21/04* (2006.01)
*F26B 21/10* (2006.01)

(58) Field of Classification Search
USPC .......................................................... 34/231
See application file for complete search history.

(56) References Cited

U.S. PATENT DOCUMENTS

| | | | | |
|---|---|---|---|---|
| 5,105,557 | A * | 4/1992 | Vadasz | F26B 5/02 |
| | | | | 34/164 |
| 5,598,641 | A * | 2/1997 | Kishi | E03D 11/11 |
| | | | | 34/247 |
| 5,659,971 | A * | 8/1997 | Haleen | F26B 5/04 |
| | | | | 34/166 |
| 5,899,001 | A | 5/1999 | Layton | |
| 6,119,367 | A * | 9/2000 | Kamikawa | H01L 21/67034 |
| | | | | 34/164 |
| 7,581,335 | B2 * | 9/2009 | Tanaka | H01L 21/67028 |
| | | | | 118/900 |
| 7,980,003 | B2 * | 7/2011 | Aoki | H01L 21/67109 |
| | | | | 34/443 |
| 8,727,665 | B2 * | 5/2014 | Pichler | E02F 5/08 |
| | | | | 405/157 |
| 9,617,680 | B2 * | 4/2017 | Kitayama | D06F 58/24 |
| 9,671,166 | B2 * | 6/2017 | Plavnik | F26B 7/00 |
| 10,006,704 | B2 * | 6/2018 | Plavnik | F26B 3/283 |
| 10,036,592 | B2 * | 7/2018 | Chen | F26B 11/00 |
| 10,139,162 | B2 * | 11/2018 | Plavnik | F26B 7/00 |
| 2008/0235981 | A1 * | 10/2008 | Kato | B29C 41/26 |
| | | | | 34/427 |
| 2018/0130676 | A1 * | 5/2018 | Zuo | F26B 21/04 |

FOREIGN PATENT DOCUMENTS

| | | | | |
|---|---|---|---|---|
| CN | 104848666 A | | 8/2015 | |
| CN | 204630274 U | | 9/2015 | |
| CN | 204665818 U | | 9/2015 | |
| EP | 3225944 A4 * | | 8/2018 | ............. F26B 11/00 |
| JP | S6167230 A | | 4/1986 | |
| JP | H10311679 A | | 11/1998 | |
| JP | 2007248035 A | | 9/2007 | |
| JP | 2009239232 A | | 10/2009 | |
| JP | 6374112 B2 * | | 8/2018 | ............. F26B 11/00 |
| WO | WO-2012076885 A3 * | | 8/2012 | ............. A45D 20/12 |
| WO | WO-2017161657 A1 * | | 9/2017 | ............. F26B 21/04 |

* cited by examiner

GROOVE-TYPE DRYING STRUCTURE

CROSS-REFERENCE TO RELATED PATENT APPLICATION

This application is a continuation application of International Patent Application No. PCT/CN2016/082456, filed on May 18, 2016, which itself claims priority to Chinese Patent Application No. CN201620224519.2 filed in China on Mar. 23, 2016. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a groove-type cleaning equipment and a wet processing equipment of a solar silicon wafer, and more particularly, to a groove-type drying structure in a processing equipment of a solar silicon wafer with the advantages of small volume, simple structure, convenient installation and high drying efficiency.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a groove-type cleaning equipment and a wet processing equipment of a solar silicon wafer, a load bearing part for loading a silicon wafer, such as a film magazine or a flower basket, needs to be placed in each container by a mechanical arm in sequence to conduct chemical corrosion or water cleaning processing. The silicon wafer and the load bearing part need to be dried after the processing usually. The common drying methods at current include a tunnel-type drying method or groove-type drying method, while the tunnel-type drying has been eliminated in the market gradually since it occupies a large area and has a low drying efficiency. The groove-type drying method used at current still has the problems of large volume, high energy consumption, low drying efficiency and complicated installation.

SUMMARY

In order to solve the technical problems of large volume, high energy consumption, low drying efficiency and complicated installation of the existing equipment for drying the silicon wafer and the load bearing part at current, the present invention puts forward a groove-type drying structure with the advantages of small volume, simple structure, convenient installation and high drying efficiency.

The groove-type drying structure proposed by the present invention comprises a drying groove having a cover. The drying groove is internally provided with an inner groove body, gaps are provided between the two sides and the bottom part of the inner groove body and the corresponding two sides and the bottom part of the drying groove to form air current channels, the upper part of the drying groove is provided with an air outlet, and the inner groove body is provided with an air compensation port communicated with the outside; a heating device and a temperature detector are installed in the air current channels at the two sides, an air wheel is arranged in the air current channel at the bottom part, an air inlet of the air wheel is communicated with an inner chamber of the inner groove body, and a rotating shaft of the air wheel is connected with a motor installed in the bottom part of the drying groove.

According to the present invention, the inner groove body is arranged in the drying groove, the air current channels are formed at the two sides and the bottom part, and the heated air is pumped by the air wheel, so that air circulation is formed inside the drying groove to dry the load bearing part and the silicon wafer. Compared with the prior art, the present invention has the advantages of small volume, simple structure, convenient installation and high drying efficiency.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 2:
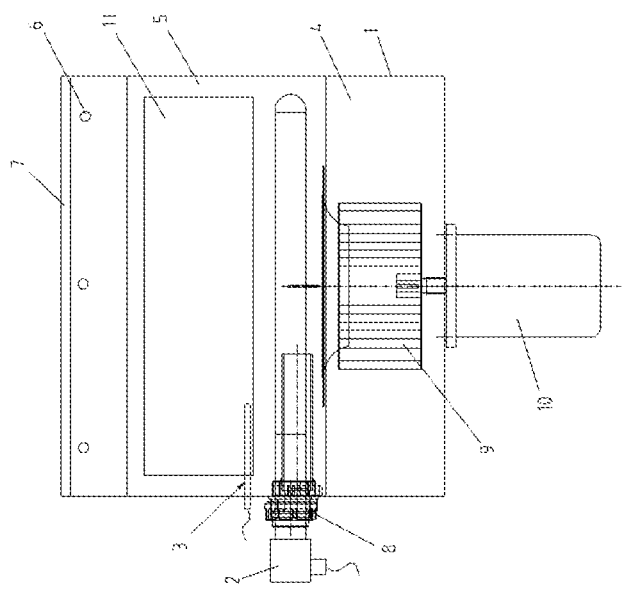
FIG. 2 is an A-A section view of FIG. 1.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 1:
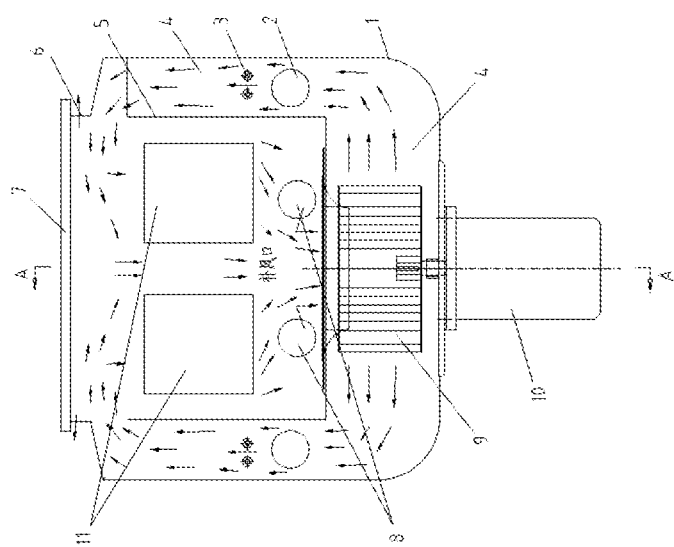
FIG. 1 is a structure diagram of a preferable embodiment of the present invention.

FIG. 1 and FIG. 2 are structure diagrams of a preferable embodiment of the present invention. The present invention proposes a groove-type drying structure, which comprises a drying groove 1 having a cover 7, wherein the drying groove 1 is internally provided with an inner groove body 5, gaps are provided between the two sides and the bottom part of the inner groove body 5 and the corresponding two sides and the bottom part of the drying groove 1 to form air current channels 4, the upper part of the drying groove 1 is provided with an air outlet 6, and the inner groove body 5 is provided with an air compensation port 8 communicated with the outside. A heating device 2 and a temperature detector 3 are installed in the air current channels at the two sides, an air wheel 9 is arranged in the air current channel at the bottom part, an air inlet of the air wheel is communicated with an inner chamber of the inner groove body 5, and a rotating shaft of the air wheel 9 is connected with a motor 10 installed in the bottom part of the drying groove 1.

With reference to FIG. 1 and FIG. 2, when a motor 10 is electrified to drive the air wheel 9 to rotate during working, air in the inner groove body 5 is pumped into the air current channel 4 at the bottom and passes through the air current channels 4 at the two sides; the air is heated when passing through the heating device 2, and then enters the inner groove body 5 from the upper part. The heated air passes through a load bearing part 11 and the silicon wafer, and then is pumped by the air wheel 9 into the air current channel 4 at the bottom, so as to form air cycle in the drying groove 1. The moisture is evaporated and taken away by the hot air so as to dry the load bearing part 11 and the silicon wafer. A temperature detector 3 is used for detecting the temperature of the air in the inner groove body 5, so as to control the heating device 2 to heat the air. Meanwhile, since the inner groove body 5 is in a negative pressure status, air may be indrawn from the outside. The drying groove 1 is provided with the air outlet 6 so as to achieve the objects that fresh air is continuously compensated, and meanwhile, the air containing moisture is continuously discharged from the drying groove 1. The present invention has the advantages of small volume, simple structure, convenient installation and high drying efficiency.

The scope of interests sough to be protected by the present invention is not limited to the size and shape of the drying groove, and is not limited to the type, power, size and shape of the heater as well, and the heating medium is not limited to the air, and may also be nitrogen or other gases. All the drying structures and drying methods above shall fall within the protection scope.

What is claimed is:

1. A groove-type drying structure, comprising a drying groove (1) having a cover (7), wherein an inner groove body (5) is installed inside the drying groove (1), the inner groove body (5) is a hollow structure having an inner chamber therein, two first gaps are respectively provided between two sides of the inner groove body (5) and corresponding two sides of the drying groove (1) and a second gap is provided between a bottom part of the inner groove body (5) and a corresponding bottom part of the driving groove (1), the first gaps and the second gap are connected to form air current channels (4) such that the air current channels (4) are communicated with the inner chamber of the inner groove body (5), an upper part of the drying groove (1) is provided with an air outlet (6), and the inner groove body (5) is provided with an air compensation port (8) communicated with an outside environment of the drying groove (1); a heating device (2) and a temperature detector (3) are installed in each of the first gaps of the air current channels, an air wheel (9) is arranged in the second gap of the air current channels, an air inlet of the air wheel is communicated with the inner chamber of the inner groove body (5), and a rotating shaft of the air wheel (9) is connected with a motor (10) installed in the bottom part of the drying groove (1).

2. The groove-type drying structure according to claim 1, wherein:
   the bottom part of the inner groove body (5) has a lower opening communicating the inner chamber of the inner groove body (5) with the second gap of the air current channels (4), and an upper part of the inner groove body (5) has an upper opening communicating the inner chamber of the inner groove body (5) with the first gaps of the air current channels (4); and
   when the motor (10) is electrified to drive the air wheel (9) to rotate during working, air in the inner chamber of the inner groove body (5) is pumped through the lower opening into the second gap of the air current channels (4) and passes through the first gaps of the air current channels (4), the air is heated when passing through the heating device (2) in each of the first gaps of the air current channels (4) and then enters the inner chamber of the inner groove body (5) through the upper opening, and the heated air passes through a load bearing part (11) and the silicon wafer and is pumped by the air wheel (9) into the second gap of the air current channels (4), so as to form an air cycle in the drying groove (1).

\* \* \* \* \*